US011137917B2

(12) United States Patent
Lee

(10) Patent No.: US 11,137,917 B2
(45) Date of Patent: Oct. 5, 2021

(54) MEMORY CONTROLLER, MEMORY SYSTEM HAVING THE MEMORY CONTROLLER, AND OPERATING METHOD OF THE MEMORY CONTROLLER

(71) Applicant: SK hynix Inc., Gyeonggi-do (KR)

(72) Inventor: Hui Won Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 121 days.

(21) Appl. No.: 16/357,554

(22) Filed: Mar. 19, 2019

(65) Prior Publication Data

US 2020/0065011 A1    Feb. 27, 2020

(30) Foreign Application Priority Data

Aug. 21, 2018 (KR) .................. 10-2018-0097649

(51) Int. Cl.
*G06F 3/06* (2006.01)
*G11C 16/22* (2006.01)
*G11C 16/26* (2006.01)
*G11C 16/04* (2006.01)
*G11C 16/10* (2006.01)

(52) U.S. Cl.
CPC ............ *G06F 3/0622* (2013.01); *G06F 3/064* (2013.01); *G06F 3/0634* (2013.01); *G06F 3/0637* (2013.01); *G06F 3/0659* (2013.01); *G06F 3/0673* (2013.01); *G11C 16/0483* (2013.01); *G11C 16/10* (2013.01); *G11C 16/22* (2013.01); *G11C 16/26* (2013.01)

(58) Field of Classification Search
CPC .... G06F 3/0673; G06F 3/0634; G06F 3/0637; G06F 3/0622; G06F 3/064; G06F 3/0659; G06F 2212/7205; G06F 12/1441; G06F 3/06; G11C 16/22; G11C 16/0483; G11C 16/10; G11C 16/26; G11C 16/04
See application file for complete search history.

(56) References Cited

U.S. PATENT DOCUMENTS

| 5,802,583 | A | * | 9/1998 | Yeager | ................. | G06F 12/1433 365/145 |
| 8,843,695 | B2 | * | 9/2014 | Shao | .................... | G06F 12/1425 711/103 |
| 2006/0067099 | A1 | * | 3/2006 | Kim | ...................... | G11C 17/146 365/94 |
| 2007/0113079 | A1 | * | 5/2007 | Ito | ........................... | G06F 21/78 713/166 |
| 2008/0168562 | A1 | * | 7/2008 | Haga | ....................... | G06F 21/14 726/23 |

(Continued)

FOREIGN PATENT DOCUMENTS

| KR | 10-2006-0059726 | 6/2006 |
| KR | 10-1406493 | 6/2014 |
| KR | 10-1463536 | 11/2014 |

*Primary Examiner* — Pierre Miche Bataille
(74) *Attorney, Agent, or Firm* — IP & T Group LLP

(57) ABSTRACT

A memory system includes a memory controller. The memory controller includes a program history manager for managing a program history of a first memory unit including a plurality of sub-units of which write protection mode is set; and a memory unit manager for selecting, based on the program history, at least one sub-unit on which a program operation is not performed during a set period among the plurality of sub-units, and releasing the write protection mode of the at least one selected sub-unit.

20 Claims, 14 Drawing Sheets

(56) References Cited

U.S. PATENT DOCUMENTS

| | | | |
|---|---|---|---|
| 2009/0083520 A1* | 3/2009 | Kanemura | G06F 12/1458 |
| | | | 712/43 |
| 2013/0132694 A1* | 5/2013 | Ono | G06F 12/145 |
| | | | 711/163 |
| 2015/0347013 A1* | 12/2015 | Mathur | G06F 12/0871 |
| | | | 711/103 |
| 2015/0347040 A1* | 12/2015 | Mathur | G06F 3/0679 |
| | | | 711/103 |
| 2015/0347041 A1* | 12/2015 | Kotte | G06F 3/064 |
| | | | 711/103 |
| 2016/0299722 A1* | 10/2016 | Seo | G06F 3/0665 |
| 2017/0308448 A1* | 10/2017 | Sato | G06F 11/073 |
| 2018/0052889 A1* | 2/2018 | Kaijima | G06F 16/24557 |
| 2018/0275914 A1* | 9/2018 | Ke | G06F 3/0608 |

\* cited by examiner

MEMORY CONTROLLER, MEMORY SYSTEM HAVING THE MEMORY CONTROLLER, AND OPERATING METHOD OF THE MEMORY CONTROLLER

CROSS-REFERENCE TO RELATED APPLICATION

The present application claims priority under 35 U.S.C. § 119(a) to Korean patent application number 10-2018-0097649, filed on Aug. 21, 2018, which is incorporated herein by reference in its entirety.

BACKGROUND

Field of Invention

The present disclosure generally relates to a memory controller, a memory system having the memory controller, and an operating method of the memory controller, and more particularly, to a memory controller capable of efficiently using a memory unit, or portion of a memory device, of which write protection mode is set, a memory system having the memory controller, and an operating method of the memory controller.

Description of Related Art

Generally, a memory system may include a memory controller and a memory device.

The memory device may store data or output stored data under the control of the memory controller. For example, the memory device may be configured as a volatile memory device in which stored data is lost when the supply of power is interrupted, or be configured as a nonvolatile memory device in which stored data is retained even when the supply of power is interrupted.

SUMMARY

Embodiments provide a memory controller capable of efficiently using a memory unit of which write protection mode is set, a memory system having the memory controller, and an operating method of the memory controller.

In accordance with an aspect of the present disclosure, there is provided a memory controller including a program history manager configured to manage a program history of a first memory unit including a plurality of sub-units of which write protection mode is set; and a memory unit manager configured to select, based on the program history, at least one sub-unit on which a program operation is not performed during a set period among the plurality of sub-units, and release the write protection mode of the at least one selected sub-unit.

In accordance with another aspect of the present disclosure, there is provided a memory system including a memory device configured to include a first memory unit including a plurality of sub-units of which write protection mode is set; and a memory controller configured to release the write protection mode of at least one sub-unit on which a program operation is not performed among the plurality of sub-units during a set period.

In accordance with still another aspect of the present disclosure, there is provided a method for operating a memory controller, the method including managing a program history of a plurality of sub-units of which write protection mode is set; selecting, based on the program history, at least one sub-unit on which a program operation is not performed during a set period among the plurality of sub-units; and releasing the write protection mode of the at least one sub-unit.

In accordance with still another aspect of the present disclosure, there is provided a memory system including a memory device including a plurality of memory units; and a memory controller suitable for setting a write protection mode to a subset of the plurality of memory units; selecting at least one memory unit among the subset of memory units based on a program history of the subset of memory units; releasing the write protection mode of the at least one memory unit; and using the at least one memory unit for an internal operation.

BRIEF DESCRIPTION OF THE DRAWINGS

Various embodiments will now be described more fully with reference to the accompanying drawings; however, elements and features may be configured or arranged differently than disclosed herein, and thus the present invention is not limited to the embodiments set forth herein. Rather, these embodiments are provided so that this disclosure is thorough and complete and fully conveys the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout. Also, throughout the specification, reference to "an embodiment," "another embodiment" or the like is not necessarily to only one embodiment, and different references to any such phrase are not necessarily to the same embodiment(s).

DETAILED DESCRIPTION

In the present disclosure, advantages, features and methods for achieving them will become more apparent after a reading of the following embodiments taken in conjunction with the drawings. The present disclosure may, however, be embodied in different forms and should not be construed as being limited to the embodiments set forth herein. Rather, these embodiments are provided to describe the present disclosure in detail to the extent that those skilled in the art to which the disclosure pertains may easily practice the present invention.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including," "comprising" or "having" a component, this indicates that the element may further include one or more other components instead of excluding such component(s), unless the context indicates otherwise. The same interpretation holds for other open-ended transition phrases.

Various embodiments of the present disclosure now will be described with reference to the accompanying drawings.

Figure 1:
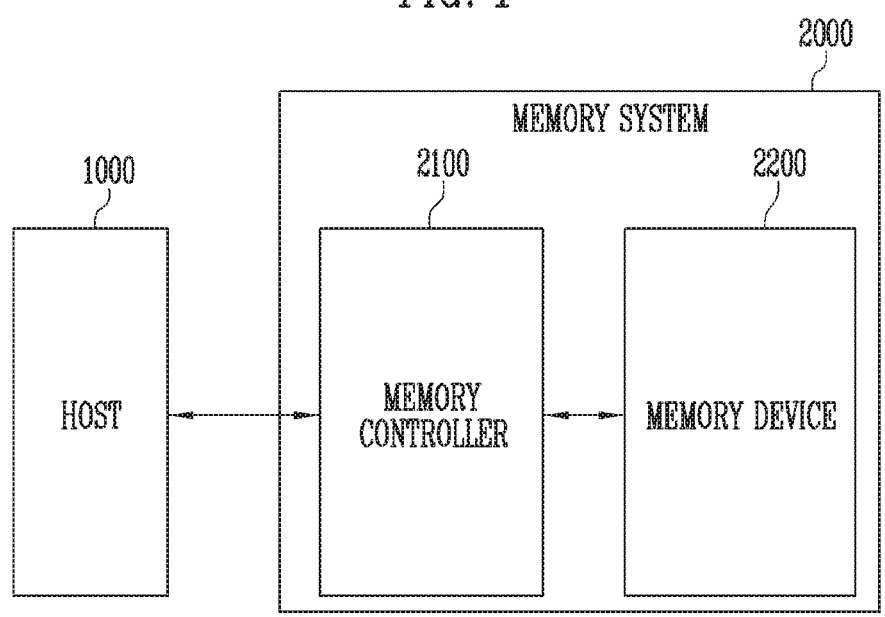
FIG. 1 is a diagram illustrating a memory system in accordance with an embodiment of the present disclosure.

FIG. 1 is a diagram illustrating a memory system 2000 in accordance with an embodiment of the present disclosure.

Referring to FIG. 1, the memory system 2000 may include a memory controller 2100 and a memory device 2200 for storing data. The memory controller 2100 may control the memory device 2200 under the control of a host 1000.

The host 1000 may communicate with the memory system 2000, using at least one interface protocol among a Non-Volatile Memory express (NVMe), a Peripheral Component Interconnect-Express (PCI-e or PCIe), an Advanced Technology Attachment (ATA), a Serial ATA (SATA), a Parallel ATA (PATA), a Universal Serial Bus (USB), a Multi-Media Card (MMC), an Enhanced Small Disk Interface (ESDI), an Integrated Drive Electronics (IDE), a Mobile Industry Processor Interface (MIPI), a Universal Flash Storage (UFS), a Small Computer Small Interface (SCSI), and a Serial Attached SCSI (SAS). However, embodiments of the present disclosure are not limited to these or any particular interface protocol between the host 1000 and the memory system 2000.

The memory controller 2100 may control overall operations of the memory system 2000, and control data exchange between the host 1000 and the memory device 2200. In a program operation, the memory controller 2100 may transmit a command, an address and data to the memory device 2200. In a read operation, the memory controller 2100 may transmit a command and an address to the memory device 2200, and receive read data from the memory device 2200. In an erase operation, the memory controller 2100 may transmit a command and an address to the memory device 2200.

The memory device 2200 may be configured as a volatile memory device in which stored data is lost when the supply of power is interrupted or as a nonvolatile memory device in which stored data is retained even when the supply of power is interrupted. The memory device 2200 may perform a program operation, a read operation, an erase operation, and a garbage collection operation under the control of the memory controller 2100.

Figure 2:
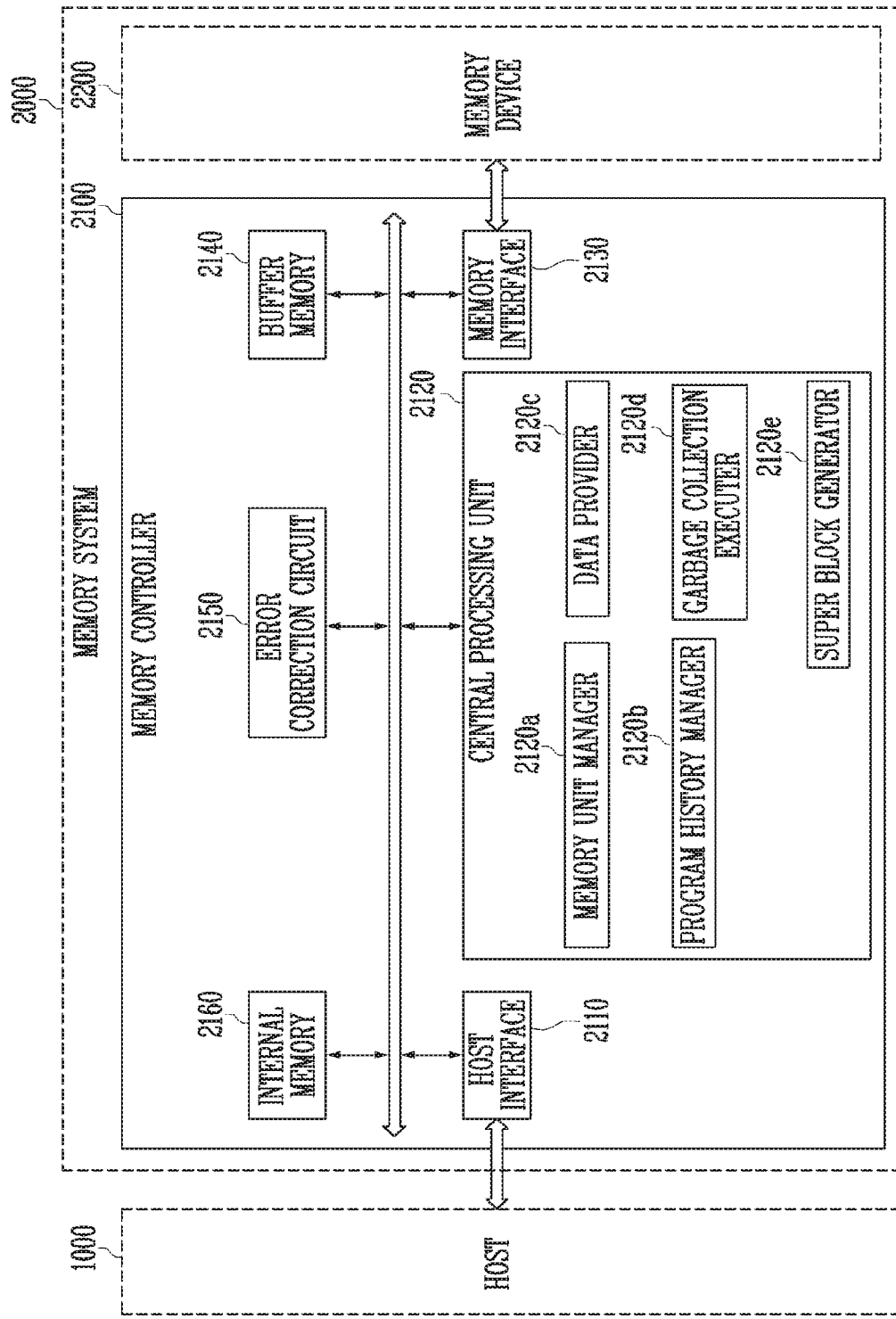
FIG. 2 is a diagram illustrating a memory controller, such as that shown in FIG. 1, in accordance with an embodiment of the present disclosure.

FIG. 2 is a diagram illustrating a memory controller, e.g., the memory controller 2100 shown in FIG. 1, in accordance with an embodiment of the present disclosure.

Referring to FIG. 2, the memory controller 2100 may include a host interface 2110, a central processing unit 2120, a memory interface 2130, a buffer memory 2140, an error correction circuit 2150, and an internal memory 2160. The host interface 2110, the memory interface 2130, the buffer memory 2140, the error correction circuit 2150, and the internal memory 2160 may be controlled by the central processing unit 2120.

The host interface 2110 may exchange data with the host 1000, using various interface protocols. For example, the host interface 2110 may communicate with the host 1000, using at least one interface protocol among a Non-Volatile Memory express (NVMe), a Peripheral Component Interconnect-Express (PCI-e or PCIe), an Advanced Technology Attachment (ATA), a Serial ATA (SATA), a Parallel ATA (PATA), a Universal Serial Bus (USB), a Multi-Media Card (MMC), an Enhanced Small Disk Interface (ESDI), an Integrated Drive Electronics (IDE), a Mobile Industry Processor Interface (MIPI), a Universal Flash Storage (UFS), a Small Computer Small Interface (SCSI), and a Serial Attached SCSI (SAS). However, embodiments of the present disclosure are not limited to these or any particular interface protocol.

The host interface 2110 may transfer various requests received from the host 1000 to the central processing unit 2120, and transfer data received from the host 1000 to the buffer memory 2140. For example, the host interface 2110 may transfer a program request, a read request and an erase request, which are received from the host 1000, to the central processing unit 2120.

The central processing unit 2120 may perform various calculations or generate a command and an address so as to control the memory device 2200. For example, the central processing unit 2120 may generate various commands necessary for a program operation, a read operation, an erase operation and a garbage collection operation.

The central processing unit 2120 may translate a logical address received from the host 1000 into a physical address so as to control an operation of the memory device 2200. The central processing unit 2120 may translate a logical address into a physical address or translate a physical address into a logical address, using an address mapping table stored in the internal memory 2160. The central processing unit 2120 may update the address mapping table when new data is programmed to the memory device 2200 or when data stored in the memory device 2200 is erased.

The central processing unit 2120 may include a memory unit manager 2120a, a program history manager 2120b, a data provider 2120c, a garbage collection executer 2120d, and a super block generator 2120e.

The memory unit manager 2120a may divide memory units or sections included in the memory device 2200 into a first memory unit and a second memory unit, and manage the first memory unit and the second memory unit. A memory unit may correspond to a portion or section of the memory device 2200, e.g., one memory block, one super block, one plane or one die. Each of the first memory unit and the second memory unit may include a plurality of sub-units. The sub-unit may be smaller than the memory unit. For example, when one memory unit is one die, the sub-units may be a plurality of planes or memory blocks included in the one die. For example, when one memory unit is one memory block, the sub-units may be a plurality of pages included in the one memory block. For example, when one memory unit is one super block, the sub-units may be a plurality of memory blocks included in the one super block. The super block may be a group defined to manage different physical memory units as one logical memory unit.

In embodiments of the present disclosure, the first memory unit may be configured such that write protection mode is set, and the second memory unit may be configured such that write protection mode is not set. For example, a program such as an operating system (OS), i.e., an OS program, may be stored in the first memory unit of which write protection mode is set. Therefore, the size of the first memory device may be set by considering the size of the OS program. For example, the size of the first memory unit may be set in advance under the control of the host 1000. In addition to the above-described OS program, various data such as a boot code may be stored in the first memory unit of which write protection mode is set. For example, the data stored in the first memory unit may be managed such that the data is permanently retained and cannot not be modified after the data is stored once.

The memory unit manager 2120a may manage the first memory unit of which write protected mode is set such that only specific data (e.g., an OS image, boot code, or the like) requested by the host 1000 can be stored in the first memory unit. That is, the memory unit manager 2120a may manage the first memory unit such that user data is not stored in the first memory unit.

The memory unit manager 2120a may release the write protection mode of at least one sub-unit among the sub-units in the first memory unit, if necessary. The memory unit manager 2120a may manage each sub-unit of which write protection mode is released, identically to the second memory unit. For example, the memory unit manager 2120a may manage each such sub-unit to be used as a space for storing user data or as a clearance necessary for an internal operation of the memory controller 2100. The internal operation may include a garbage collection operation or an operation such as bad block processing.

The memory unit manager 2120a may release the write protection mode of a sub-unit on which a program operation is not performed during a set period among the sub-units in the first memory unit. To this end, the memory unit manager 2120a may receive a program history of the plurality of sub-units in the first memory unit from the program history manager 2120b. The program history may comprise information on the number of sub-units at which the program operation is performed. The memory unit manager 2120a may check sub-units on which the program operation is not performed during the set period based on the received program history.

In an embodiment, the memory unit manager 2120a may release the write protection mode of all sub-units in the first memory unit on which the program operation is not performed during the set period.

In an embodiment, the memory unit manager 2120a may release the write protection mode of some of the sub-units in the first memory unit on which the program operation is not performed during the set period. For example, the memory unit manager 2120a may determine a number of sub-unit(s) of which the write protection mode is to be released by considering a free unit rate, i.e., a rate at which free unit(s) occupy the sub-units on which the write protection mode is set. In other words, the memory unit manager 2120a may determine the number of sub-unit(s) of which the write protection mode is to be released by considering the free unit rate at which free unit(s) occupy the first memory unit except the sub-unit(s) of which the write protection mode is to be released. The memory unit manager 2120a may determine the number of sub-unit(s) of which the write protection mode is to be released such that the free unit rate is greater than or equal to a threshold value. The memory unit manager 2120 may release the write protection mode of sub-units as many as the determined number. Additional detail concerning calculation and use of the free unit rate is described below.

In an embodiment, after the write protection mode of at least one sub-unit among the sub-units in the first memory unit is released, the memory unit manager 2120a may recalculate the free unit rate when data is programmed in at least one of sub-units of which the write protection mode is currently set. When the recalculated free unit rate is lowered, the memory unit manager 2120a may reset the write protection mode with respect to one or more of the at least one sub-unit of which write protection mode is released. The memory unit manager 2120a may reset the write protection mode of such sub-unit(s) such that the free unit rate becomes greater than or equal to the threshold value.

In an embodiment, before the write protection mode is reset as described above, the memory unit manager 2120a may check whether data is programmed in the corresponding sub-unit. When the data is programmed, the memory unit manager 2120a may copy the programmed data to the second memory unit, and erase the data programmed in the corresponding sub-unit. Subsequently, the memory unit manager 2120a may reset the write protection mode with respect to the corresponding sub-unit.

In an embodiment, when a read request for a sub-unit of which write protection mode is released is received from the host 1000, the memory unit manager 2120a may control the data provider 2120c such that set data can be provided to the host 1000, regardless of whether data is programmed in the corresponding sub-unit. Accordingly, the data provider 2120c may generate data having a size corresponding to the corresponding sub-unit, and provide the host 1000 with the generated data as read data about the corresponding sub-unit. For example, the data generated by the data provider 2120c may be data representing that the corresponding sub-unit is in an erase state. For example, in the data generated by the data provider 2120c, each of the bits may have a value of a logic high (i.e., '1') or a value of a logic low (i.e., '0'), such that the data is either all 1's or all 0's.

In an embodiment, the memory unit manager 2120a may provide information on the sub-unit of which write protection mode is released in the first memory unit and information on the second memory unit to the garbage collection executer 2120d and/or the super block generator 2120e.

The program history manager 2120b may manage a program history of the sub-units included in the first memory unit. The program history may represent how many times a program operation has been performed on each of the sub-units in the first memory unit during a set period.

The data provider 2120c may generate set data under the control of the memory unit manager 2120a and provide the generated data to the host 1000.

When one sub-unit corresponds to one memory block, the garbage collection executer 2120d may perform a garbage collection operation on a memory unit or sub-units, of which write protection mode is not set. For example, the garbage collection executer 2120d may select a victim unit, among the sub-units included in the second memory unit, and select, as a target unit, a sub-unit of which write protection mode is released in the first memory unit. That is, the garbage collection executer 2120d may collect data in the victim unit and move the collected data into the target unit.

When one sub-unit corresponds to one memory block, the super block generator 2120e may form a super block, using memory blocks in the second memory unit. When any one memory block in the super block is determined as a bad block, the super block generator 2120e may replace the bad block with another memory block. The memory block used to replace the bad block may be a memory block of which write protection mode is released in the first memory unit.

The memory interface 2130 may communicate with the memory device 2200 using various interface protocols.

The buffer memory 2140 may temporarily store data while the memory controller 2100 is controlling the memory device 2200. For example, data received from the host 1000 until a program operation is completed may be temporarily stored in the buffer memory 2140. In addition, data read from the memory device 2200 during a read operation may be temporarily stored in the buffer memory 2140.

The error correction circuit 2150 may perform error correction encoding and error correction decoding to detect an error in a program operation or read operation.

The internal memory 2160 may be used as a storage for storing various information for an operation of the memory controller 2100. The internal memory 2160 may store a plurality of tables. For example, the internal memory 2160 may store an address mapping table in which logical and physical addresses are mapped.

Figure 3:
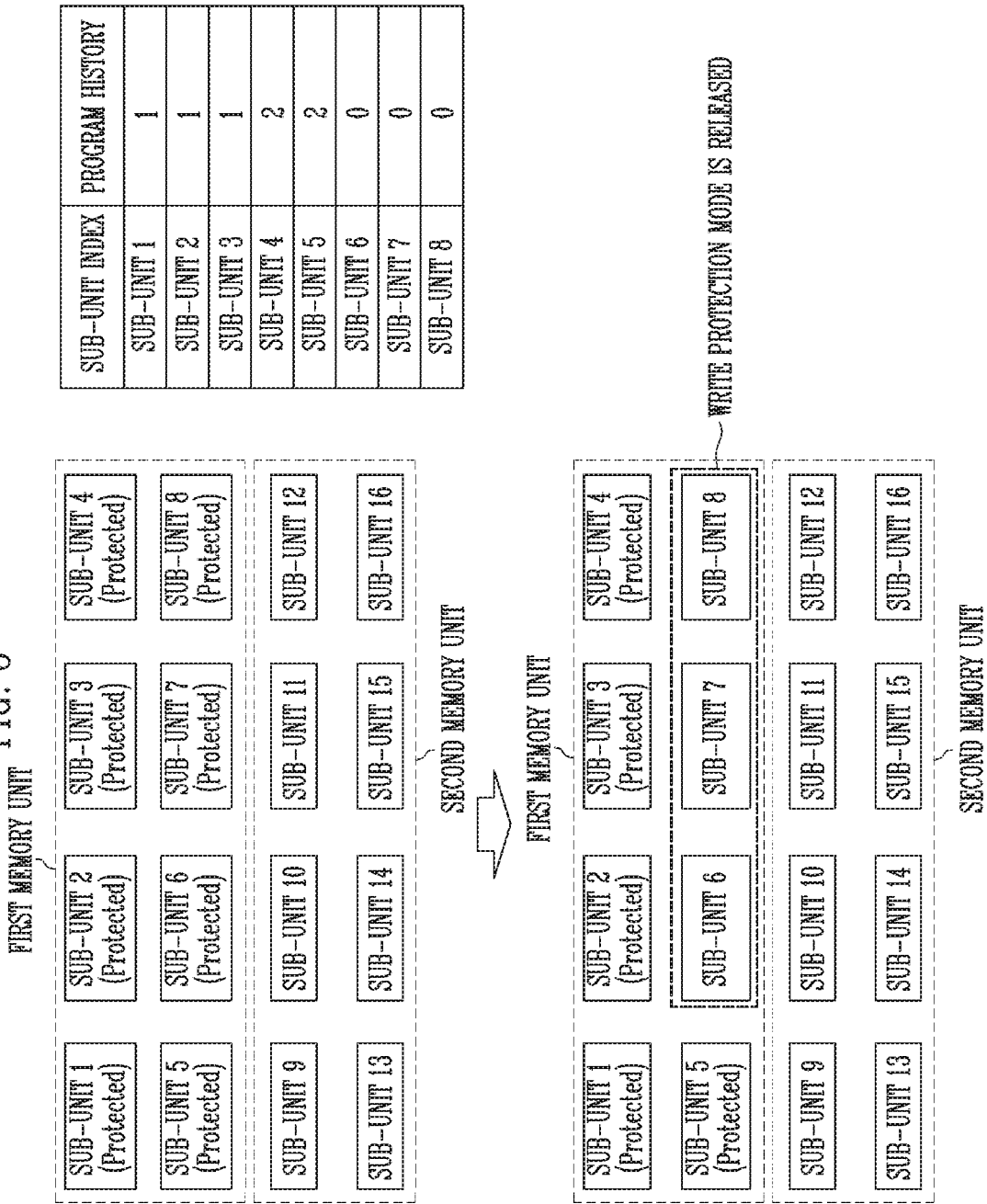
FIG. 3 is a diagram illustrating a process of releasing a write protection mode in accordance with an embodiment of the present disclosure.

FIG. 3 is a diagram illustrating a process of releasing a write protection mode in accordance with an embodiment of the present disclosure.

In the embodiment described with reference to FIG. 3, the memory device includes a first memory unit and a second memory unit. In FIG. 3, 'Protected' represents that the write protection mode is set. That is, in the illustrated embodiment, the write protection mode is set with respect to sub-units 1 to 8 in the first memory unit, and is not set with respect to sub-units 9 to sub-unit 16 in the second memory unit.

As described above, the memory controller may manage a program history of the sub-units in the first memory unit. The program history may represent how many times a program operation has been performed on each of the sub-units in the first memory unit during a set period. As shown in FIG. 3, during the set period, the program operation is performed once on each of sub-unit 1 to sub-unit 3, the program operation is performed twice on each of sub-unit 4 and sub-unit 5, and the program operation is not performed on any of sub-unit 6 to sub-unit 8.

The memory controller may release the write protection mode of at least one sub-unit among the sub-units in the first memory unit based on the program history about the sub-units in the first memory unit. For example, the memory controller may release the write protection mode of at least one sub-unit among the sub-units 6 to 8 in the first memory unit, on which the program operation is not performed during the set period. In FIG. 3, a case where the write protection mode of all the sub-units 6 to 8 in the first memory unit, on which the program operation is not performed during the set period, is released, is illustrated as an example.

Figure 4:
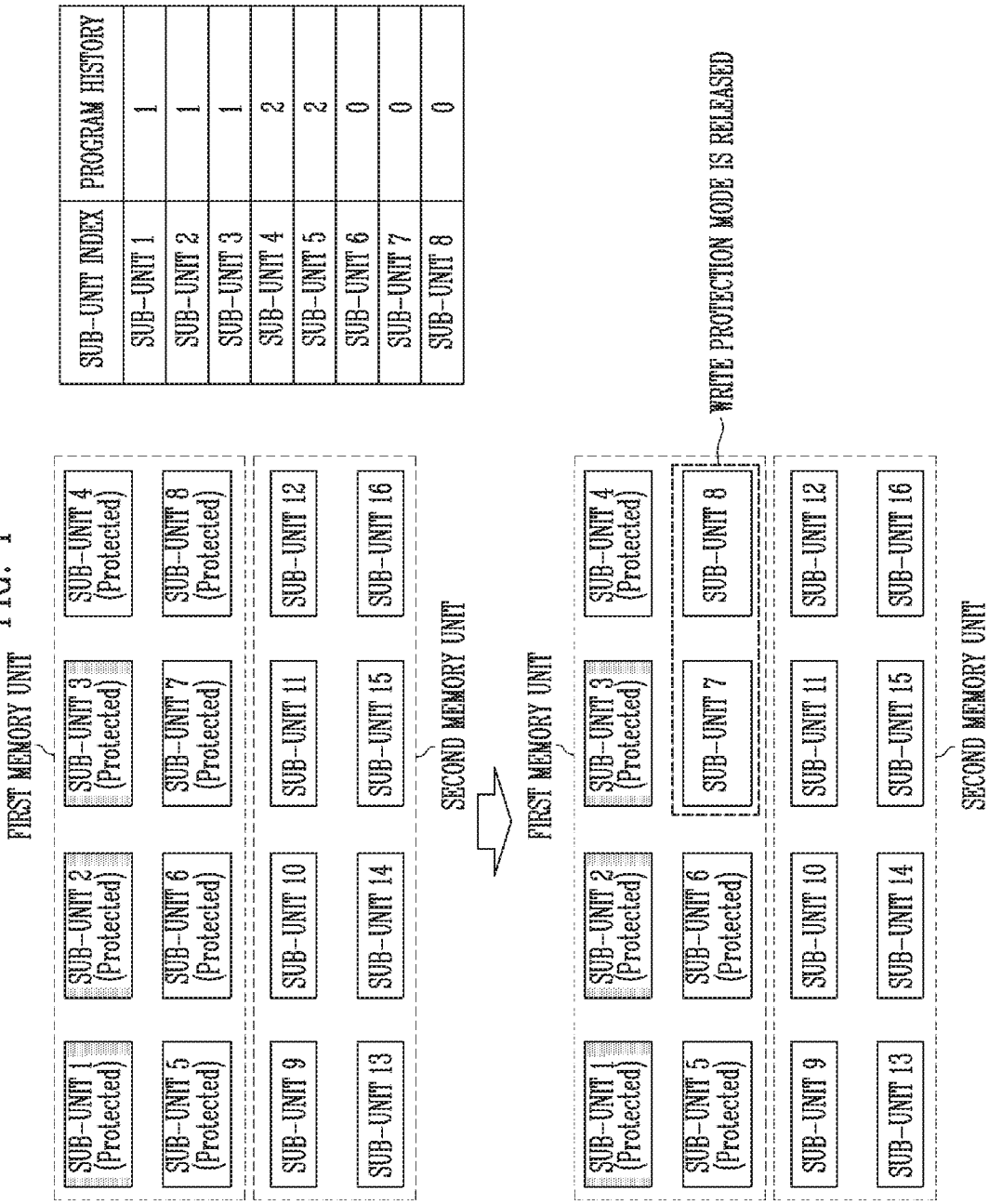
FIG. 4 is a diagram illustrating a process of releasing a write protection mode, by considering a free unit rate, in accordance with an embodiment of the present disclosure.

FIG. 4 is a diagram illustrating a process of releasing a write protection mode by considering a free unit rate in accordance with an embodiment of the present disclosure.

In the embodiment described with reference FIG. 4, as compared with the embodiment of FIG. 3, a case where data is programmed in sub-unit 1 to sub-unit 3 is disclosed. In FIG. 4, the sub-units in which the data is programmed are indicated by dots along the vertical edges of the blocks depicting those sub-units. This is the same in FIGS. 5 to 7.

The memory controller may determine the number of sub-units of which write protection mode is to be released by considering a free unit rate. For example, the memory controller may determine the number of sub-units of which write protection mode is to be released such that the free unit rate is not less than a threshold value. In the embodiment described with reference to FIG. 4, the threshold value is 0.5.

In the example shown in FIG. 4, when write protection mode of all the sub-units (e.g., sub-unit 6 to sub-unit 8) in the first memory unit, on which the program operation is not performed during the set period, is released, the number of sub-units of which write protection mode remains set may be five (i.e., sub-unit 1 to sub-unit 5), and the number of free units (e.g., sub-units 4 and 5) among the sub-units 1 to 5) of which write protection mode is set may be two. In this example, the free unit rate is 0.4. That is, when the write protection mode of sub-units 6 to 8 in the first memory unit, on which the program operation is not performed during the set period, is released, the free unit rate (e.g., 0.4) may be less than the threshold value (e.g., 0.5).

In the example shown in FIG. 4, when write protection mode of only sub-unit 7 and sub-unit 8, among the sub-units 6 to 8 in the first memory unit, on which the program operation is not performed during the set period, is released, the number of sub-units (e.g., sub-unit 1 to sub-unit 6) of which write protection mode is set may be six, and the number of free units (e.g., sub-unit 4 to sub-unit 6) among the sub-units 1 to 6 of which write protection mode is set may be three. The free unit rate may be 0.5. That is, when the write protection mode of only sub-unit 7 and sub-unit 8, among the sub-units 6 to 8 in the first memory unit, on which the program operation is not performed during the set period, is released, the free unit rate (e.g., 0.5) may not be less than the threshold value (e.g., 0.5). Therefore, the memory controller may release the write protection mode of only the sub-unit 7 and the sub-unit 8.

Figure 5:
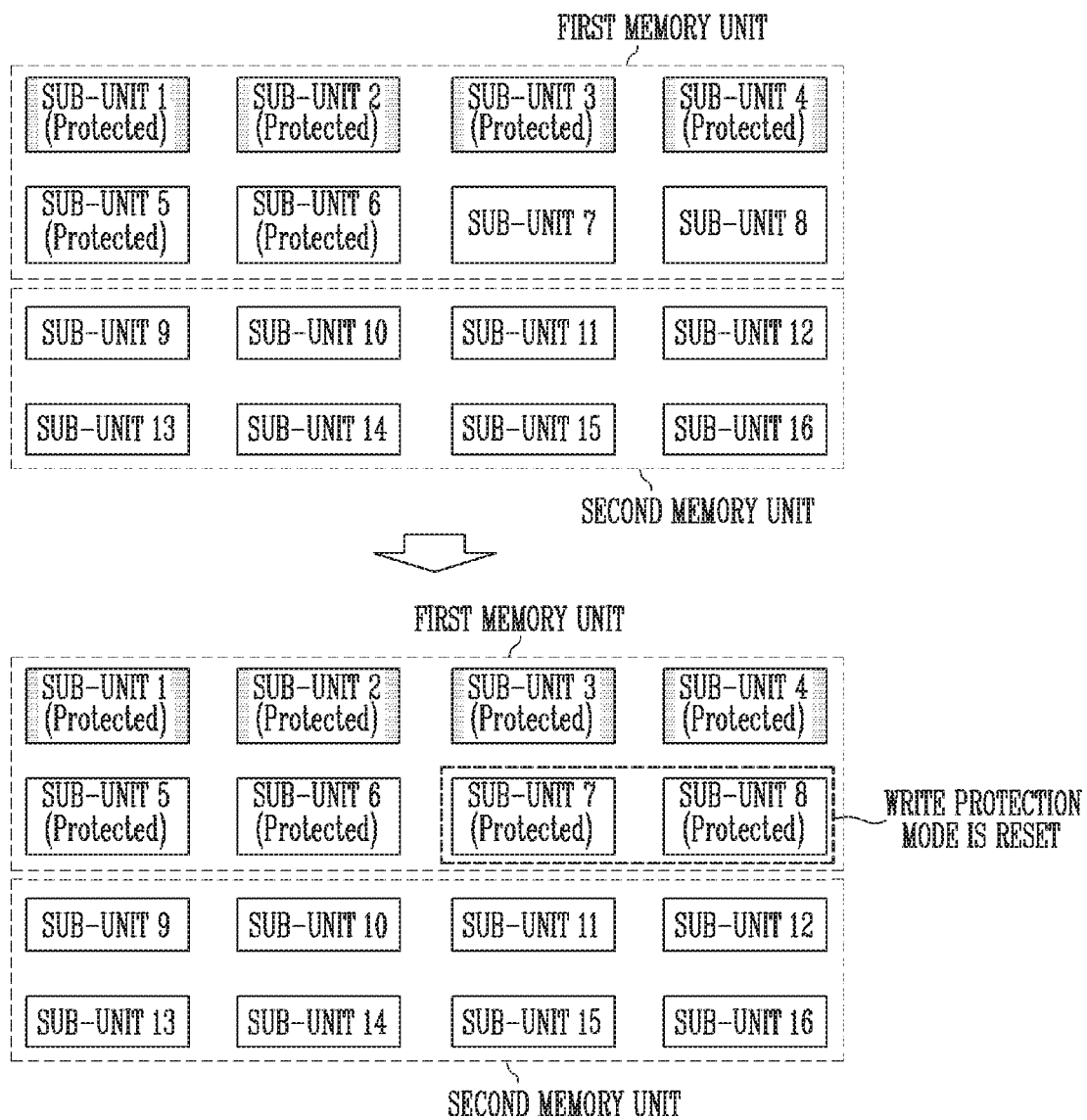
FIG. 5 is a diagram illustrating a process of resetting a write protected mode in accordance with an embodiment of the present disclosure.

FIG. 5 is a diagram illustrating a process of resetting a write protected mode in accordance with an embodiment of the present disclosure.

Referring to FIG. 5, as described with reference to FIG. 4, there is illustrated a case where data is programmed in sub-unit 4 after the write protection mode of sub-unit 7 and sub-unit 8, which are included in the first memory unit, is released.

When data is programmed in sub-units to which the write protection mode is set, the memory controller may recalculate the free unit rate. In the example of FIG. 5, the rate of free units (e.g., sub-unit 5 and sub-unit 6) among the sub-units 1 to 6 of which write protection mode is set is about 0.33.

When the free unit rate becomes less than the threshold value, the memory controller may reset the write protection mode of at least one sub-unit among the sub-units of which write protection mode is released. For example, the memory controller may reset the write protection mode such that the free unit rate becomes greater than or equal to the threshold value. When the threshold value is 0.5, the free unit rate may become 0.5 when the write protection mode of sub-unit 7 and sub-unit 8 is reset. Therefore, the memory controller may reset the write protection mode of sub-unit 7 and sub-unit 8 as shown in FIG. 5.

Figure 6:
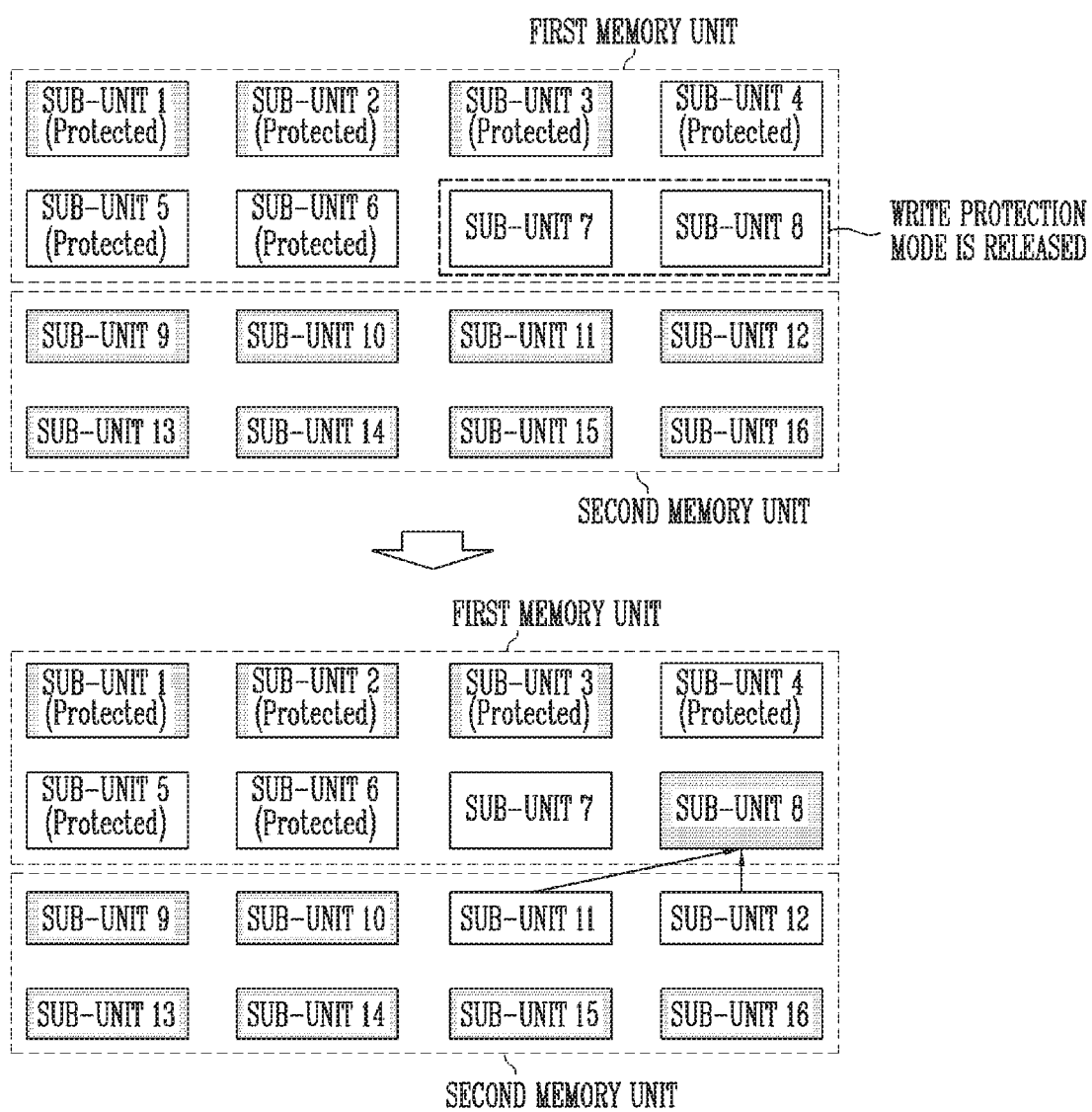
FIG. 6 is a diagram illustrating a process of performing a garbage collection operation, using sub-units of which write protected mode is released, in accordance with an embodiment of the present disclosure.

FIG. 6 is a diagram illustrating a process of performing a garbage collection operation, using sub-units of which write protected mode is released, in accordance with an embodiment of the present disclosure.

In the embodiment described with reference to FIG. 6, a case where each sub-unit is a memory block is illustrated. In addition, a case where the write protection mode of sub-unit 7 and sub-unit 8 among the sub-units included in the first memory unit is released is illustrated.

When the garbage collection operation is performed, the memory controller may select a victim unit among the sub-units included in the second memory unit, and select a target unit among the sub-units of which write protection mode is released among the sub-units included in the first memory unit.

In the example shown in FIG. 6, sub-unit 8 of which write protection mode is released among the sub-units included in the first memory unit is selected as the target unit, and sub-unit 11 and sub-unit 12 among the sub-units included in the second memory unit are selected as the victim unit.

Therefore, the memory controller may move valid data programmed in sub-unit 11 and sub-unit 12 to sub-unit 8.

Figure 7:
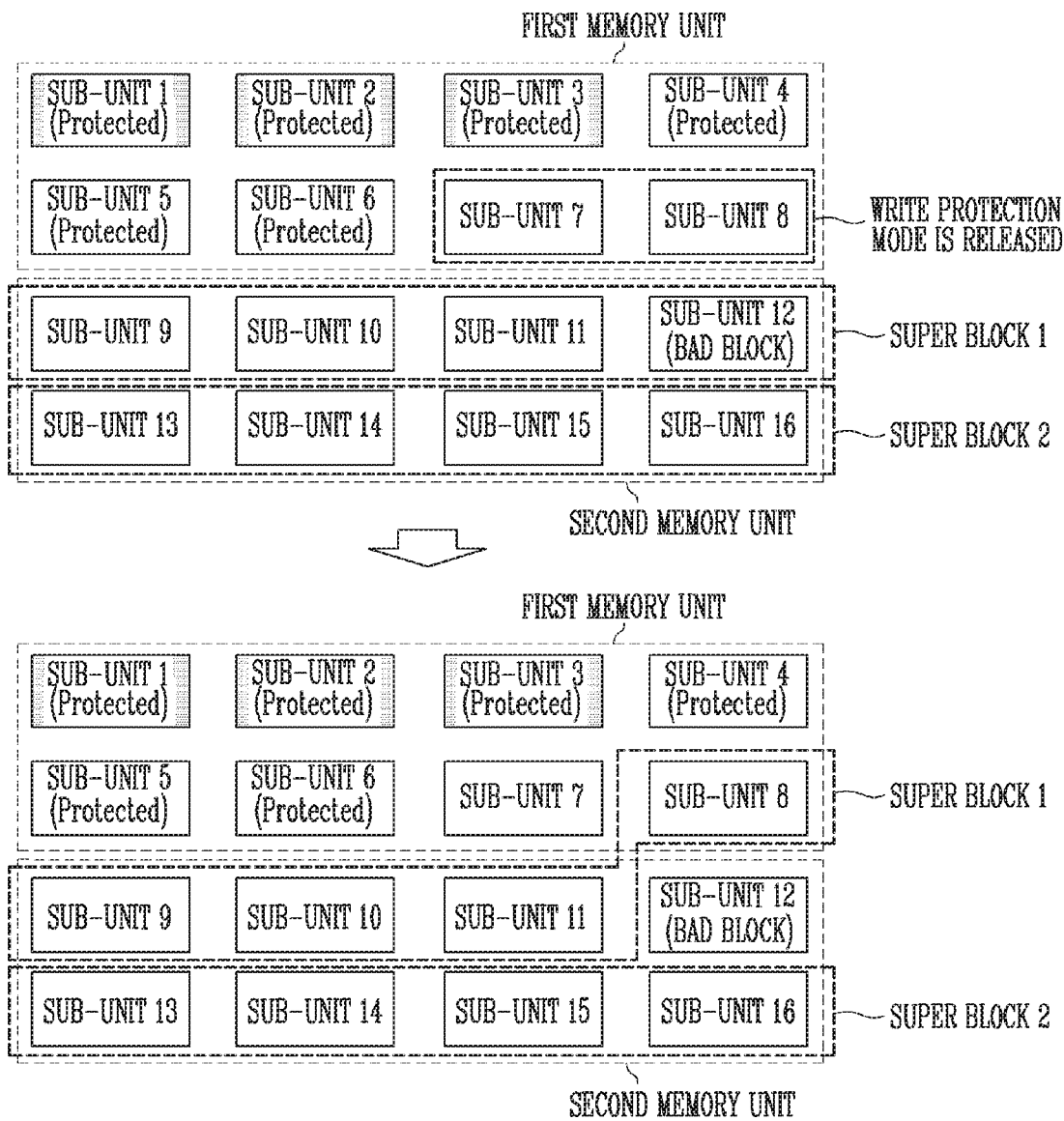
FIG. 7 is a diagram illustrating a process of forming a super block, using sub-units of which write protected mode is released, in accordance with an embodiment of the present disclosure.

FIG. 7 is a diagram illustrating a process of forming a super block, using sub-units of which write protected mode is released, in accordance with an embodiment of the present disclosure.

In the embodiment described with reference to FIG. 7, a case where each sub-unit is a memory block is disclosed. In addition, a case where the write protection mode of the sub-unit 7 and the sub-unit 8 among the sub-units in the first memory unit is released is disclosed.

The memory controller may manage the sub-units included in the second memory unit in units of super blocks. For example, the memory controller may manage sub-unit 9 to sub-unit 12 as super block 1, and manage sub-unit 13 to sub-unit 16 as super block 2.

Figure 12:
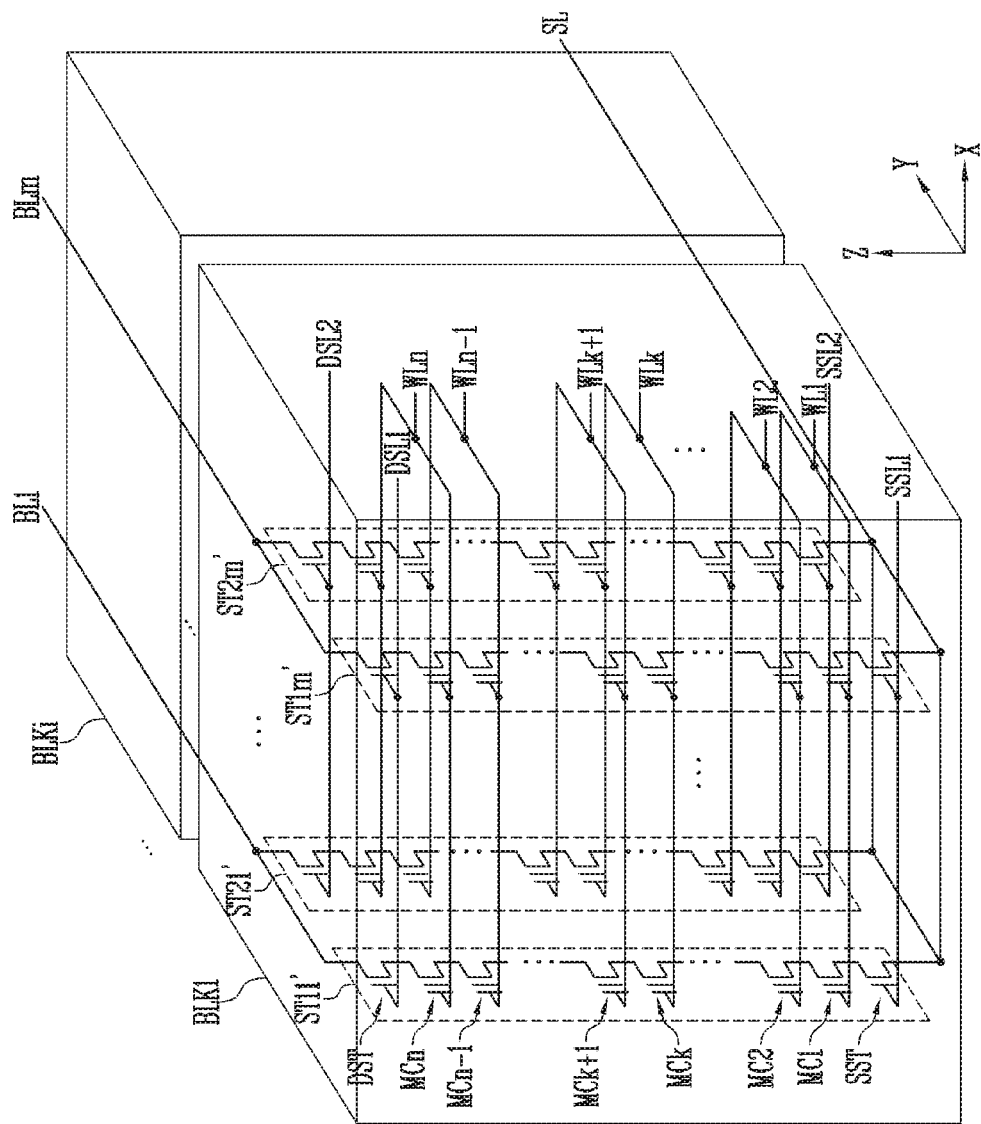
FIG. 12 is a diagram illustrating another embodiment of a memory block having a three-dimensional structure.

In the embodiment of FIG. 12, sub-unit 12 in the super block 1 is determined as a bad block. The memory controller may use a sub-unit of which write protection mode is released among the sub-units in the first memory unit as a replacement block for the bad block.

That is, as shown in FIG. 7, the memory controller may manage super block 1 such that sub-unit 12, which has been determined as a bad block, is excluded from the super block 1, and further manage super block 1 such that sub-unit 8 of which write protection mode is released is included in the super block 1.

Figure 8:
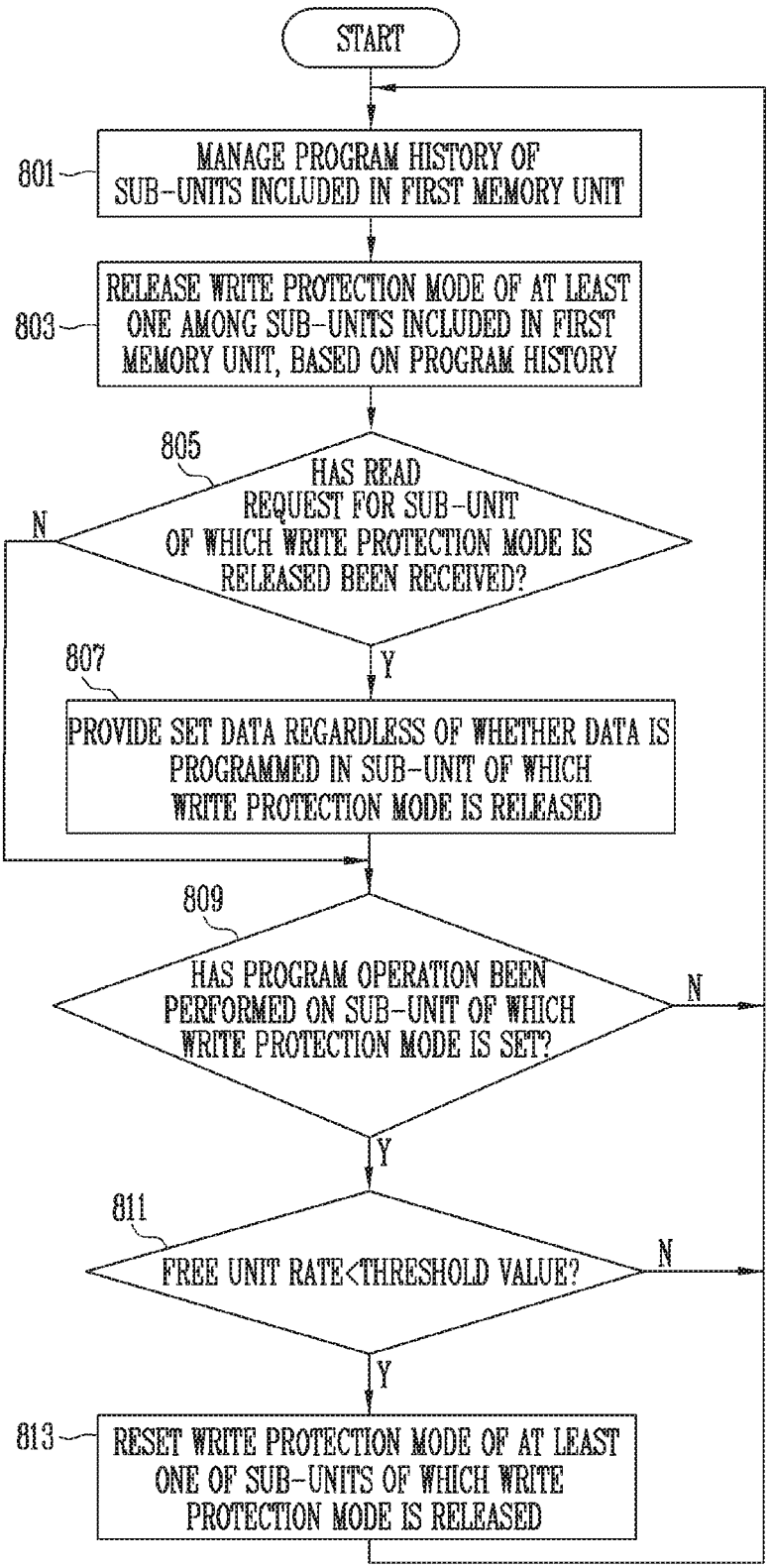
FIG. 8 is a flowchart illustrating an operating method of a memory controller in accordance with an embodiment of the present disclosure.

FIG. 8 is a flowchart illustrating an operating method of a memory controller in accordance with an embodiment of the present disclosure. The steps shown in FIG. 8 are exemplary. In an embodiment, less than all of the illustrated steps may be performed. In another embodiment, multiple steps may be combined into a single step. In still another embodiment, the order of certain steps may be changed.

Referring to FIG. 8, at step 801, the memory controller may manage a program history of sub-units in a first memory unit. For example, the memory controller may manage the number of program operations performed on each of the sub-units in the first memory unit during a set period.

At step 803, the memory controller may release a write protection mode of at least one sub-unit among the sub-units in the first memory unit, based on the program history. In an embodiment, the memory controller may release the write protection mode of sub-units on which the program operation is not performed among the sub-units in the first memory unit during the set period. In an embodiment, the memory controller may determine the number of sub-units of which write protection mode is to be released by considering a free unit rate, as defined above.

At step 805, when a read request for the sub-unit of which write protection mode is released among the sub-units in the first memory unit is received from the host (Y at step 805), the memory controller may proceed to step 807. Otherwise (N at step 805), the memory controller may proceed to step 809.

At the step 807, the memory controller may generate information representing that there is no data stored in the sub-unit of which write protection mode is released. Then, the memory controller may provide the generated information to the host, regardless of whether data is programmed in the sub-unit of which write protection mode is released. For example, the memory controller may provide information representing that there is no stored data to the host without performing a read operation of the sub-unit of which write protection mode is released.

At the step 809, when the program operation is performed on the sub-unit of which write protection mode is set (Y at step 809), the memory controller may proceed to step 811. Otherwise (N at step 809), the memory controller may return to the step 801.

At the step 811, the memory controller may calculate a rate of free units among the sub-units of which write protection mode is set. When the calculated rate of free units is less than a threshold value (Y at step 811), the memory controller may proceed to step 813. Otherwise (N at step 811), the memory controller may return to the step 801.

At the step 813, the memory controller may reset the write protection mode of at least one of the sub-units of which write protection mode is released among the sub-units in the first memory unit.

Figure 9:
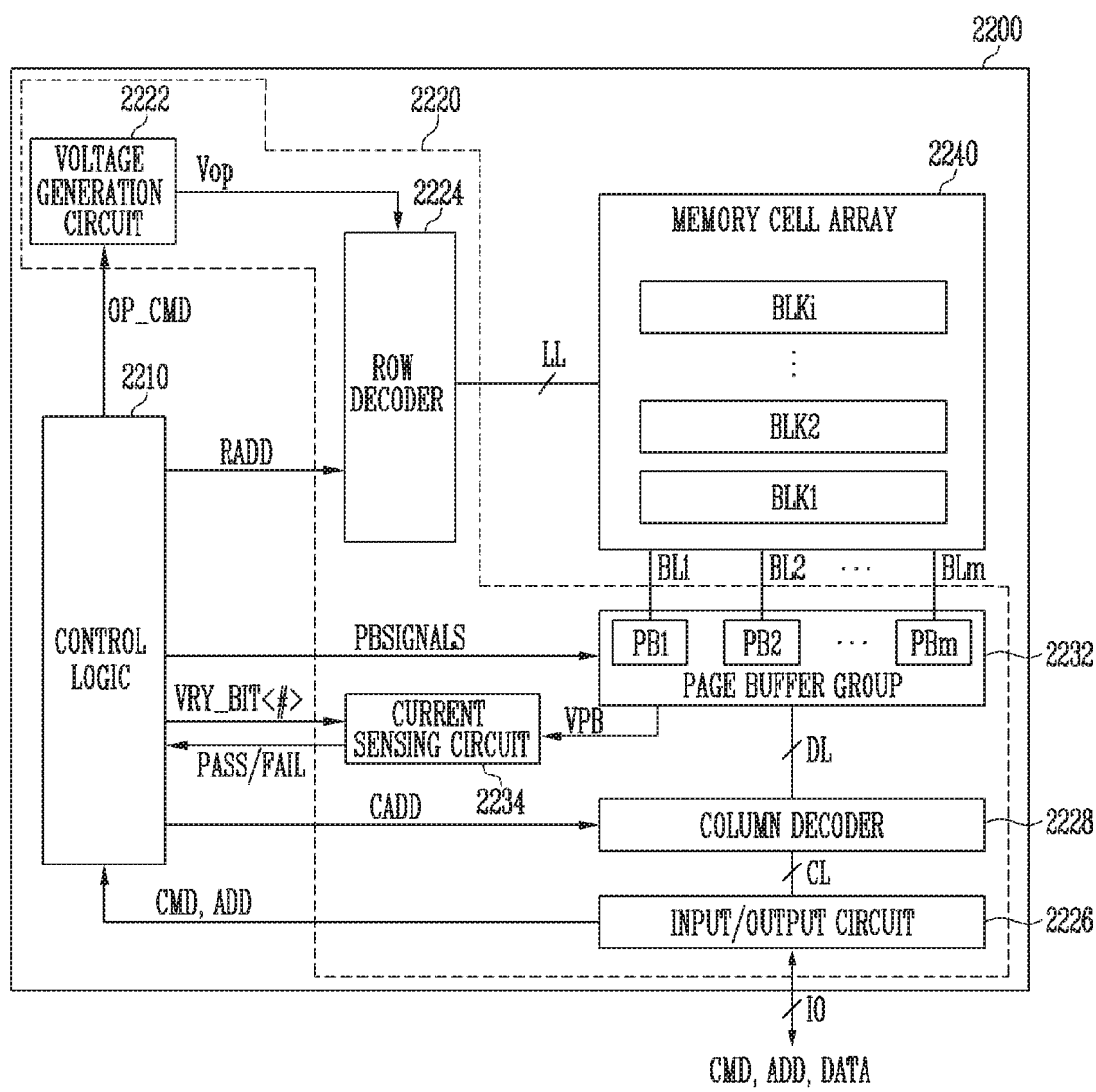
FIG. 9 is a diagram illustrating a memory device in accordance with an embodiment of the present disclosure.

FIG. 9 is a diagram illustrating a memory device in accordance with an embodiment of the present disclosure. The memory device shown in FIG. 9 may be applied to the memory system shown in FIGS. 1 and 2.

Referring to FIG. 9, the memory device 2200 may include control logic 2210, a peripheral circuit 2220, and a memory cell array 2240. The peripheral circuit 2220 may include a voltage generation circuit 2222, a row decoder 2224, an input/output circuit 2226, a column decoder 2228, a page buffer group 2232, and a current sensing circuit 2234.

The control logic 2210 may control the peripheral circuit 2220 under the control of the memory controller 2100 shown in FIGS. 1 and 2.

The control logic 2210 may control the peripheral circuit 2220 in response to a command CMD and an address ADD, which are received from the memory controller 2100 through the input/output circuit 2226.

For example, the control logic 2210 may output an operation signal OP_CMD, a row address RADD, page buffer control signals PBSIGNALS, an enable bit VRY_BIT<#>, and a column address CADD in response to the command CMD and the address ADD. The control logic 2210 may determine whether a verify operation has passed or failed in response to a pass or fail signal PASS or FAIL received from the current sensing circuit 2234.

The peripheral circuit 2220 may perform a program operation for storing data in the memory cell array 2240, a read operation for outputting data stored in the memory cell array 2240, and an erase operation for erasing data stored in the memory cell array 2240.

The voltage generation circuit 2222 may generate various operating voltages Vop used in program, read, and erase operations in response to the operation signal OP_CMD received from the control logic 2210. For example, the voltage generation circuit 2222 may transfer a program voltage, a verify voltage, a pass voltage, a read voltage, an erase voltage, a turn-on voltage, and the like to the row decoder 2224.

The row decoder 2224 may transfer the operating voltages Vop to local lines LL connected to a selected memory block among memory blocks of the memory cell array 2240 in response to the row address RADD received from the control logic 2210. The local lines LL may include local word lines, local drain select lines, and local source select lines. In addition, the local lines LL may include various lines such as a source line, which are connected to the memory block.

The input/output circuit 2226 may transfer the command CMD and the address ADD, which are received from the memory controller 2100, to the control logic 2210 through input/output lines TO, or exchange data DATA with the column decoder 2228.

The column decoder 2228 may transfer data between the input/output circuit 2226 and the page buffer group 2232 in response to a column address CADD received from the control logic 2210. For example, the column decoder 2228 may exchange data with page buffers PB1 to PBm through data lines DL, or exchange data with the input/output circuit 2226 through column lines CL.

The page buffer group 2232 may be connected to bit lines BL1 to BLm commonly connected to memory blocks BLK1 to BLKi. The page buffer group 2232 may include a plurality of page buffers PB1 to PBm connected to the bit lines BL1 to BLm. For example, one page buffer may be connected to each of the bit lines. The page buffers PB1 to PBm may operate in response to the page buffer control signals PBSIGNALS received from the control logic 2210. For example, in a program operation, the page buffers PB1 to PBI may temporarily store program data received from the memory controller 2100, and adjust a voltage applied to the bit lines BL1 to BLm according to the program data. In a read operation, the page buffers PB1 to PBI may temporarily store data received through the bit lines BL1 to BLm, or sense a voltage or current of the bit lines BL1 to BLm.

In a read or verify operation, the current sensing circuit 2234 may generate a reference current in response to the enable bit VRY_BIT<#> received from the control logic 2210. Then, the current sensing circuit 2234 may output a pass or fail signal PASS or FAIL by comparing a sensing voltage VPB received from the page buffer group 2232 with a reference voltage generated by the reference current.

The memory cell array 2240 may include a plurality of memory blocks BLK1 to BLKi in which data is stored. User data and various information required to perform an operation of the memory device 2200 may be stored in the memory blocks BLK1 to BLKi. The memory blocks BLK1 to BLKi may be implemented in a two-dimensional structure or a three-dimensional structure, and be configured identical to one another.

Figure 10:
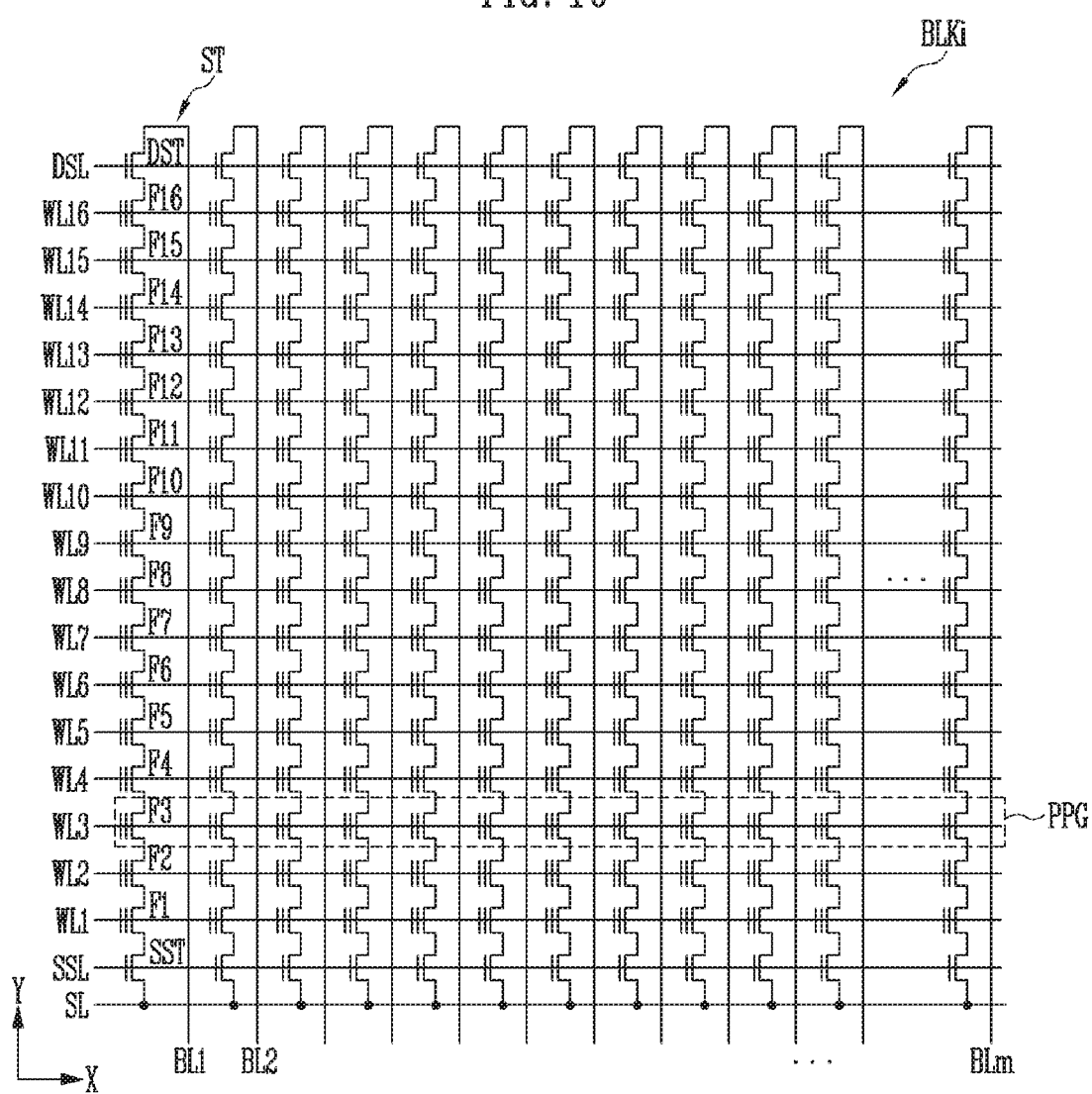
FIG. 10 is a diagram illustrating an example of a memory block.

FIG. 10 is a diagram illustrating an example of a memory block.

A memory cell array may include a plurality of memory blocks. Memory block BLKi, which is representative of any of the plurality of memory blocks in the memory device 2200, is illustrated in FIG. 10.

In the memory block BLKi, a plurality of word lines arranged in parallel to one another may be connected between a first select line and a second select line. The first select line may be a source select line SSL, and the second select line may be a drain select line DSL. Specifically, the memory block BLKi may include a plurality of strings ST connected between bit lines BL1 to BLm and a source line SL. The bit lines BL1 to BLm may be connected to the strings ST, respectively, and the source line SL may be commonly connected to the strings ST. The strings ST may be configured identically to one another, and therefore, a string ST connected to a first bit line BL1 will be described in detail as an example.

The string ST may include a source select transistor SST, a plurality of memory cells F1 to F16, and a drain select transistor DST, which are connected in series to each other between the source line SL and the first bit line BL1. At least one source select transistor SST and at least one drain select transistor DST may be included in one string ST, and memory cells of which number is larger than that of the memory cells F1 to F16 shown in the drawing may be included in one string ST.

A source of the source select transistor SST may be connected to the source line SL, and a drain of the drain select transistor DST may be connected to the first bit line BL1. The memory cells F1 to F16 may be connected in series between the source select transistor SST and the drain select transistor DST. Gates of source select transistors SST included in different strings ST may be connected to the source select line SSL, gates of drain select transistors DST included in different strings ST may be connected to the drain select line DSL, gates of the memory cells F1 to F16 included in different strings ST may be connected to a plurality of word lines WL1 to WL16. A group of memory cells connected to the same word line among the memory cells included in different strings ST may be a physical page PPG. Therefore, physical pages PPG of which number corresponds to that of the word lines WL1 to WL16 may be included in the memory block BLKi.

One memory cell may store data of one bit. This is called as a single level cell (SLC). One physical page PPG may store one logical page (LPG) data. The one LPG data may include data bits of which number corresponds to that of cells included in one physical page PPG. For example, when data of two or more bits is stored in one memory cell, one physical page PPG may store two or more LPG data. For example, in a memory device driven in an MLC type, two LPG data may be stored in one physical page PPG. In a memory device driven in a TLC type, three LPG data may be stored in the one physical page PPG.

Figure 11:
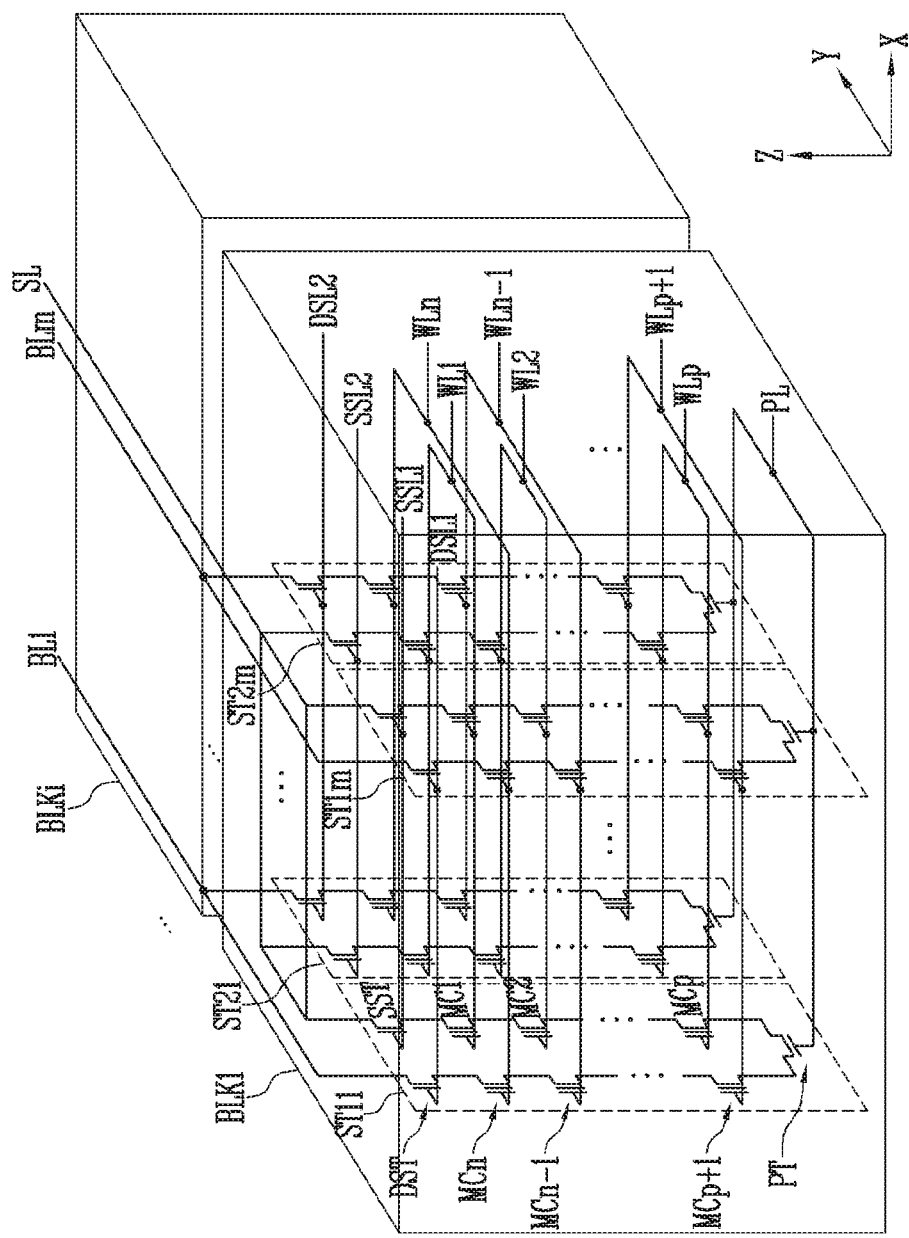
FIG. 11 is a diagram illustrating an embodiment of a memory block having a three-dimensional structure.

FIG. 11 is a diagram illustrating an embodiment of a memory block having a three-dimensional structure.

The memory cell array 2240 may include a plurality of memory blocks BLK1 to BLKi. A first memory block BLK1 will be described as an example. The first memory block BLK1 may include a plurality of strings ST11 to ST1m and ST21 to ST2m. In an embodiment, each of the plurality of strings ST11 to ST1m and ST21 to ST2m may be formed in a 'U' shape. In the first memory block BLK1, m strings may be arranged in a row direction (X direction). Although FIG. 11 illustrates that two strings are arranged in a column direction (Y direction), this is for clarity; three or more strings may be arranged in the column direction (Y direction).

Each of the plurality of strings ST11 to ST1m and ST21 to ST2m may include at least one source select transistor SST, first to nth memory cells MC1 to MCn, a pipe transistor PT, and at least one drain select transistor DST.

The source and drain select transistors SST and DST and the memory cells MC1 to MCn may have structures similar to one another. For example, each of the source and drain select transistors SST and DST and the memory cells MC1 to MCn may include a channel layer, a tunnel insulating layer, a charge trapping layer, and a blocking insulating layer. For example, a pillar for providing the channel layer may be provided in each string. For example, a pillar for providing at least one of the channel layer, the tunnel insulating layer, the charge trapping layer, and the blocking insulating layer may be provided in each string.

The source select transistor SST of each string may be connected between a source line SL and memory cells MC1 to MCp.

In an embodiment, source select transistors of strings arranged in the same row may be connected to a source select line extending in the row direction, and source select transistors of strings arranged in different rows may be connected to different source select lines. In FIG. 11, source select transistors of strings ST11 to ST1m of a first row may be connected to a first source select line SSL1. Source select transistors of strings ST21 to ST2m of a second row may be connected to a second source select line SSL2.

In another embodiment, the source select transistors of the strings ST11 to ST1m and ST21 to ST2m may be commonly connected to one source select line.

First to nth memory cells MC1 to MCn of each string may be connected between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a vertical direction (Z direction), and be connected in series to each other between the source select transistor SST and the pipe transistor PT. The (p+1)th to nth memory cells MCp+1 to MCn may be sequentially arranged in the vertical direction (Z direction), and be connected in series to each other between the pipe transistor PT and the drain select transistor DST. The first to pth memory cells MC1 to MCp and the (p+1)th to nth memory cells MCp+1 to MCn may be connected to each other through the pipe transistor PT. Gates of the first to nth memory cells MC1 to MCn of each string may be connected to first to nth word lines WL1 to WLn, respectively.

In an embodiment, at least one of the first to nth memory cells MC1 to MCn may be used as a dummy memory cell. When a dummy memory cell is provided, the voltage or current of a corresponding string can be stably controlled. A gate of the pipe transistor PT of each string may be connected to a pipe line PL.

The drain select transistor DST of each string may be connected to a bit line and the memory cells MCp+1 to MCn. Strings arranged in the row direction may be connected to a drain select line extending in the row direction. Drain select transistors of the strings ST11 to ST1m, of the first row may be connected to a first drain select line DSL1. Drain select transistors of the strings ST21 to ST2m of the second row may be connected to a second drain select line DSL2.

Strings arranged in the column direction may be connected to bit lines extending in the column direction. In FIG. 11, strings ST11 and ST21 of a first column may be connected to a first bit line BL1. Strings ST1m and ST2m of an mth column may be connected to an mth bit line BLm.

Memory cells connected to the same word line among the strings arranged in the row direction may constitute one page. For example, memory cells connected to the first word line WL1 among the strings ST11 to ST1m of the first row may constitute one page. Memory cells connected to the first word line WL1 among the strings ST21 to ST2m of the second row may constitute another page. When any one of the drain select lines DSL1 and DSL2 is selected, strings arranged in one row direction may be selected. When any one of the word lines WL1 to WLn is selected, one page among the selected strings may be selected.

FIG. 12 is a diagram illustrating another embodiment of a memory block having a three-dimensional structure.

The memory cell array 2240 may include a plurality of memory blocks BLK1 to BLKi. A first memory block BLK1 will be described as an example. The first memory block BLK1 may include a plurality of strings ST11' to ST1m' and ST21' to ST2m'. Each of the plurality of strings ST11' to ST1m' and ST21' to ST2m' may extend along a vertical direction (Z direction). In the first memory block BLK1, m' strings may be arranged in a row direction (X direction). Although FIG. 12 illustrates that two strings are arranged in a column direction (Y direction), this is for clarity; three or more strings may be arranged in the column direction (Y direction).

Each of the plurality of strings ST11' to ST1m' and ST21' to ST2m' may include at least one source select transistor SST, first to nth memory cells MC1 to MCn, and at least one drain select transistor DST.

The source select transistor SST of each string may be connected between a source line SL and the memory cells MC1 to MCn. Source select transistors of strings arranged in the same row may be connected to the same source select line. Source select transistors of strings ST11' to ST1m' arranged on a first row may be connected to a first source select line SSL1. Source select transistors of strings ST21' to ST2m' arranged on a second row may be connected to a second source select line SSL2. In another embodiment, the source select transistors of the strings ST11' to ST1m' and ST21' to ST2m' may be commonly connected to one source select line.

The first to nth memory cells MC1 to MCn of each string may be connected in series to each other between the source select transistor SST and the drain select transistor DST. Gates of the first to nth memory cells MC1 to MCn may be connected to first to nth word lines WL1 to WLn, respectively.

In an embodiment, at least one of the first to nth memory cells MC1 to MCn may be used as a dummy memory cell. When a dummy memory cell is provided, the voltage or current of a corresponding string can be stably controlled. Accordingly, the reliability of data stored in the first memory block BLK1 can be improved.

The drain select transistor DST of each string may be connected between a bit line and the memory cells MC1 to MCn. Drain select transistors DST of strings arranged in the row direction may be connected to a drain select line extending in the row direction. The drain select transistors DST of the strings ST11' to ST1m' of the first row may be connected to a first drain select line DSL1. The drain select transistors DST of the strings ST21' to ST2m' of the second row may be connected to a second drain select line DSL2.

That is, the first memory block BLK1 of FIG. 12 may have a circuit identical to that of the first memory block BLK1 of FIG. 11, except that the pipe transistor PT is excluded from each string.

Figure 13:
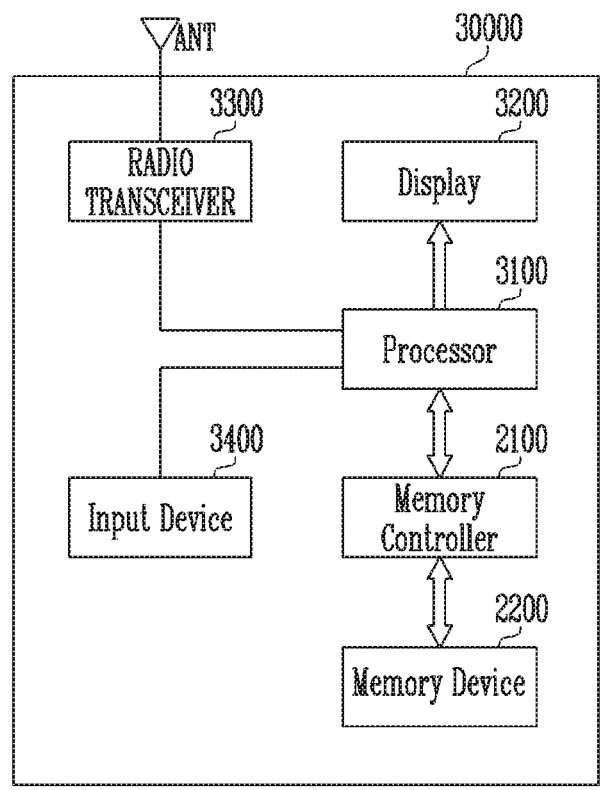
FIGS. 13 to 16 are diagrams illustrating other examples of the memory system including the memory controller shown in FIGS. 1 and 2.

FIG. 13 is a diagram illustrating another example of the memory system including the memory controller shown in FIGS. 1 and 2.

Referring to FIG. 13, the memory system 30000 may be implemented as a cellular phone, a smart phone, a tablet PC, a personal digital assistant (PDA), or a wireless communication device. The memory system 30000 may include a memory controller 2100 and a memory device 2200. The memory controller 2100 may control an operation of the memory device 2200.

The memory controller 2100 may control a data access operation of the memory device 2200, e.g., a program operation, an erase operation, a read operation, or the like under the control of a processor 3100.

Data programmed in the memory device 2200 may be output through a display 3200 under the control of the memory controller 2100.

A radio transceiver 3300 may transmit/receive radio signals through an antenna ANT. For example, the radio transceiver 3300 may convert a radio signal received through the antenna ANT into a signal that can be processed by the processor 3100. Therefore, the processor 3100 may process a signal output from the radio transceiver 3300 and transmit the processed signal to the memory controller 2100 or the display 3200. The memory controller 2100 may transmit the signal processed by the processor 3100 to the memory device 2200. Also, the radio transceiver 3300 may convert a signal output from the processor 3100 into a radio signal, and output the converted radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 2100, data output from the radio transceiver 3300, or data output from the input device 3400 can be output through the display 3200.

In some embodiments, the memory controller 2100 capable of controlling an operation of the memory device 2200 may be implemented as a part of the processor 3100, or be implemented as a chip separate from the processor 3100.

Figure 14:
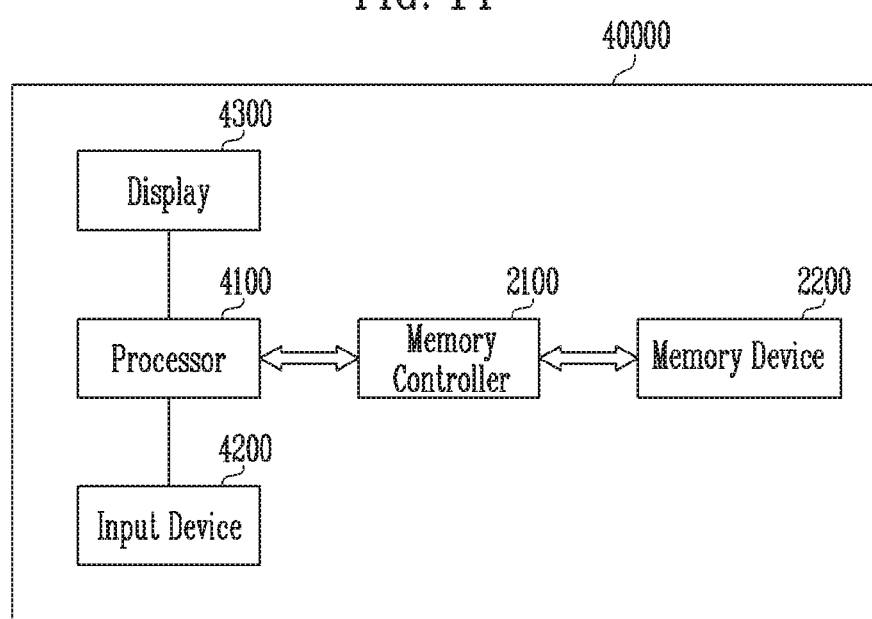

FIG. 14 is a diagram illustrating another example of the memory system including the memory controller shown in FIGS. 1 and 2.

Referring to FIG. 14, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include a memory controller 2100 and a memory device 2200. The memory controller 2100 may control a data processing operation of the memory device 2200.

A processor 4100 may output data stored in the memory device 2200 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 2100. In some embodiments, the memory controller 2100 capable of controlling an operation of the memory device 2200 may be implemented as a part of the processor 4100, or be implemented as a chip separate from the processor 4100.

Figure 15:
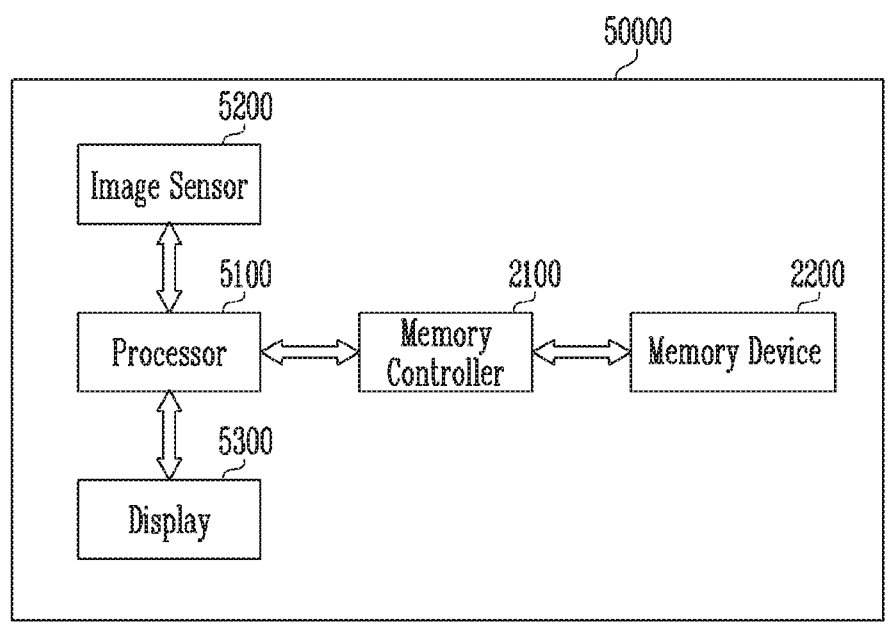

FIG. 15 is a diagram illustrating another example of the memory system including the memory controller shown in FIGS. 1 and 2.

Referring to FIG. 15, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory controller 2100 and a memory device 2200. The memory controller 2100 may control a data processing operation of the memory device 2200, e.g., a program operation, an erase operation, or a read operation.

An image sensor 5200 of the memory system 50000 may convert an optical image into digital signals, and the converted digital signals may be transmitted to a processor 5100 or the memory controller 2100. Under the control of the processor 5100, the converted digital signals may be output through a display 5300, or be stored in the memory device 2200 through the memory controller 2100. In addition, data stored in the memory device 2200 may be output through the display 5300 under the control of the processor 5100 or the memory controller 2100.

In some embodiments, the memory controller 2100 capable of controlling an operation of the memory device 2200 may be implemented as a part of the processor 5100, or be implemented as a chip separate from the processor 5100.

Figure 16:
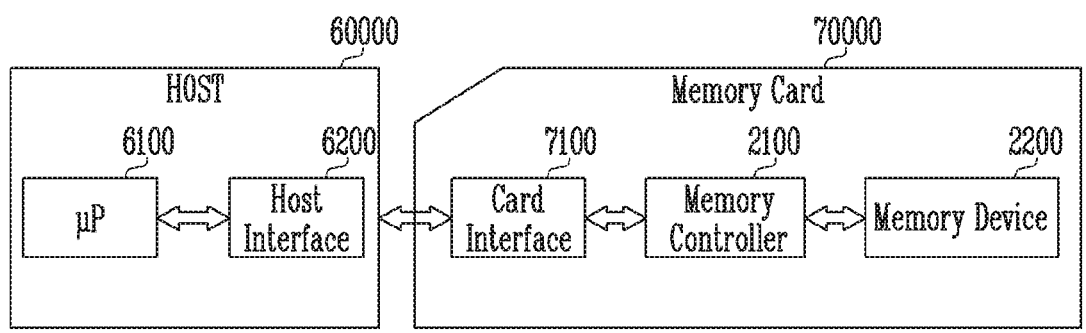

FIG. 16 is a diagram illustrating another example of the memory system including the memory controller shown in FIGS. 1 and 2.

Referring to FIG. 16, the memory system 70000 may be implemented as a memory card or a smart card. The memory system 70000 may include a memory controller 2100, a memory device 2200, and a card interface 7100.

The memory controller 2100 may control data exchange between the memory device 2200 and the card interface 7100. In some embodiments, the card interface 7100 may be a Secure Digital (SD) card interface or a Multi-Media Card (MMC) interface, but the present disclosure is not limited thereto.

The card interface 7100 may interface data exchange between a host 60000 and the memory controller 2100 according to a protocol of the host 60000. In some embodiments, the card interface 7100 may support a Universal Serial Bus (USB) protocol and an Inter-Chip (IC)-USB protocol. The card interface 7100 may mean hardware capable of supporting a protocol used by the host 60000, software embedded in the hardware, or a signal transmission scheme.

When the memory system 70000 is connected to a host interface 6200 of the host 60000 such as a PC, a tablet PC, a digital camera, a digital audio player, a cellular phone, console video game hardware, or a digital set-top box, the host interface 6200 may perform data communication with the memory device 2200 through the card interface 7100 and the memory controller 2100 under the control of a microprocessor (μP) 6100.

In accordance with embodiments of the present disclosure, a memory unit of which write protection mode is set can be efficiently used.

Various embodiments have been disclosed herein, and although specific terms are employed, they are used and are to be interpreted in a generic and descriptive sense and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method for operating a memory controller, the method comprising:
   managing a program history of a plurality of sub-units of which write protection mode is set;
   detecting, based on the program history, at least one sub-unit on which a program operation is not performed during a set period among the plurality of sub-units; and
   releasing the write protection mode of the at least one sub-unit in response to detection of the at least one sub-unit,
   wherein the program history of the first memory unit includes information on a number of program operations performed on each of the plurality of sub-units during the set period.

2. The method of claim 1, wherein the selecting of the at least one sub-unit includes selecting the at least one sub-unit of which write protection mode is to be released such that a rate of free units in which data is not stored among sub-units except the at least one sub-unit among the plurality of sub-units is greater than or equal to a threshold value.

3. The method of claim 2, further comprising:
   programming data in the at least one sub-unit of which write protection mode is released in response to a request from a host;
   recalculating the rate of free units; and
   when the recalculated rate of free units is less than the threshold value, resetting the write protection mode for a portion of the at least one sub-unit of which write protection mode is released.

4. The method of claim 1, further comprising:
   when a read request for the at least one sub-unit of which write protection mode is released is received from the host, generating information representing that data is not programmed in the at least one sub-unit, regardless of whether data is programmed in the at least one sub-unit; and
   providing the host with the generated information as read data about the at least one sub-unit.

5. A memory controller comprising:
   a program history manager configured to manage a program history of a first memory unit including a plurality of sub-units of which write protection mode is set; and
   a memory unit manager configured to detect, based on the program history, at least one sub-unit on which a program operation is not performed during a set period among the plurality of sub-units, and release the write protection mode of the at least one sub-unit in response to detection of the at least one sub-unit,
   wherein the program history of the first memory unit includes information on a number of program operations performed on each of the plurality of sub-units during the set period.

6. The memory controller of claim 5, wherein the memory unit manager selects the at least one sub-unit such that a rate of free units in which data is not stored among sub-units except the at least one sub-unit among the plurality of sub-units is greater than or equal to a threshold value.

7. The memory controller of claim 6, wherein, when the rate of free units decreases, the memory unit manager resets the write protection mode for a portion of the at least one sub-unit of which write protection mode is released.

8. The memory controller of claim 7, wherein the memory unit manager resets the write protection mode for the portion of the at least one sub-unit of which write protection mode is released such that the rate of free units is greater than or equal to the threshold value.

9. The memory controller of claim 7, wherein, when data is programmed in the at least one sub-unit of which write protection mode is released, the memory unit manager copies the programmed data to a second memory unit of which write protection mode is not set, and erases the programmed data from the at least one sub-unit.

10. The memory controller of claim 5, further comprising a data provider configured to, when a read request for the at least one sub-unit of which write protection mode is released is received from a host, omit a read operation of the at least one sub-unit, regardless of whether data is programmed in the at least one sub-unit, and provide the host with information representing that there is no data stored in the at least one sub-unit.

11. The memory controller of claim 5, further comprising a garbage collection executer configured to perform a garbage collection operation, using the at least one sub-unit of which write protection mode is released.

12. The memory controller of claim 5, further comprising a super block generator configured to form a super block, using the at least one sub-unit of which write protection mode is released.

13. A memory system comprising:
   a memory device configured to include a first memory unit including a plurality of sub-units of which write protection mode is set; and
   a memory controller configured to manage a program history of the first memory unit including information on a number of program operations performed on each of the plurality of sub-units during a set period and to release the write protection mode of at least one sub-unit when the at least one sub-unit on which a program operation is not performed among the plurality of sub-units during the set period is detected based on the program history.

14. The memory system of claim 13, wherein the memory controller selects the at least one sub-unit such that a rate of free units in which data is not stored among sub-units except the at least one sub-unit among the plurality of sub-units is greater than or equal to a threshold value.

15. The memory system of claim 14, wherein, when the rate of free units decreases, the memory controller resets the write protection mode for a portion of the at least one sub-unit of which write protection mode is released.

16. The memory system of claim 15, wherein the memory controller resets the write protection mode for the portion of the at least one sub-unit of which write protection mode is released such that the rate of free units is greater than or equal to the threshold value.

17. The memory system of claim 13, further comprising a second memory unit of which write protection mode is not set,
   wherein, when data is programmed in the at least one sub-unit of which write protection mode is released, the memory controller copies the programmed data to the second memory unit, and erases the programmed data from the at least one sub-unit.

18. The memory system of claim 13, wherein, when a read request for the at least one sub-unit of which write protection mode is released is received from a host, the memory controller omits a read operation of the at least one sub-unit, regardless of whether data is programmed in the at least one sub-unit, and provides the host with information representing that there is no data stored in the at least one sub-unit.

19. The memory system of claim 13, wherein the memory controller performs a garbage collection operation, using the at least one sub-unit of which write protection mode is released.

20. The memory system of claim 13, wherein the memory controller formed a super block, using the at least one sub-unit of which write protection mode is released.

* * * * *